United States Patent [19]
Castro et al.

[11] Patent Number: 5,959,299
[45] Date of Patent: Sep. 28, 1999

[54] UNCOOLED INFRARED SENSORS FOR THE DETECTION AND IDENTIFICATION OF CHEMICAL PRODUCTS OF COMBUSTION

[75] Inventors: Carlos A. Castro; Malcolm J. Bevan, both of Garland; Sebastian R. Borrello, Dallas, all of Tex.; Kent R. Carson, Alexandria, Va.; Luigi Colombo, Dallas, Tex.; Herbert F. Schaake, Denton, Tex.; Donald F. Weirauch, Dallas, Tex.

[73] Assignee: Raytheon Company, Lexington, Mass.

[21] Appl. No.: 08/831,101

[22] Filed: Apr. 1, 1997

Related U.S. Application Data

[60] Provisional application No. 60/014,809, Apr. 4, 1996.

[51] Int. Cl.$^6$ ............................................. H01L 31/0296
[52] U.S. Cl. ........................... 250/339.15; 250/370.13; 250/339.15; 250/339.01; 250/339.02; 250/339.13
[58] Field of Search ........................ 250/370.13, 339.15, 250/339.01, 339.02, 339.13

[56] References Cited

U.S. PATENT DOCUMENTS

| | | |
|---|---|---|
| 4,296,324 | 10/1981 | Kern et al. . |
| 4,370,557 | 1/1983 | Axmark et al. . |
| 4,594,226 | 6/1986 | Reedy . |
| 4,691,196 | 9/1987 | Kern et al. . |
| 4,769,775 | 9/1988 | Kern et al. . |
| 4,785,292 | 11/1988 | Kern et al. . |
| 4,956,686 | 9/1990 | Borrello et al. . |
| 5,036,203 | 7/1991 | Solomon ......................... 250/370.06 |
| 5,144,138 | 9/1992 | Kinch et al. . |
| 5,249,954 | 10/1993 | Allen et al. . |
| 5,422,484 | 6/1995 | Brogi et al. ....................... 250/339.15 |
| 5,583,338 | 12/1996 | Goodwin ........................... 250/338.4 |

*Primary Examiner*—Constantine Hannaher
*Assistant Examiner*—Andrew Israel
*Attorney, Agent, or Firm*—Baker & Botts, L.L.P.

[57] ABSTRACT

This is a sensor for, and a method of, determining if a particular type of flame is present, using at least two uncooled HgCdTe detector films on a common IR transmissive substrate. Specific examples of the types of radiation which can be identified include gasoline flames, natural gas flames, and organic combustion flames (identified, e.g., by comparing the amount of combined carbon dioxide and carbon monoxide to the amount of water vapor). The ratio of carbon dioxide to carbon monoxide can also be determined. The sensor can include a first HgCdTe filter (88) on a common IR transmissive substrate (42), a first uncooled HgCdTe detector film (86) over the first filter (88), and a second uncooled HgCdTe detector film (92) on a CdTe insulator which is either on the first uncooled HgCdTe detector film, or on a second HgCdTe filter (94) provided on the common IR transmissive substrate.

19 Claims, 5 Drawing Sheets

BUNSEN FLAME

UNCOOLED INFRARED SENSORS FOR THE DETECTION AND IDENTIFICATION OF CHEMICAL PRODUCTS OF COMBUSTION

This application claims priority under 35 USC §119(e)(1) of provisional application No. 60/014,809 filed Apr. 4, 1996.

CROSS-REFERENCE T COMMONLY-OWNED, CO-FILED, RELATED APPLICATIONS

The following are commonly-owned, co-filed, related applications, and are incorporated by reference herein; "NARROW BAND INFRARED FILTER DETECTORS" U.S. Ser. No. 09/131,893 filed Aug. 10, 1998; "MERCURY CADMIUM TELLURIDE INFRARED FILTERS AND DETECTORS AND METHODS OF FABRICATION" U.S. Pat. No. 5,861,626, issued Jan. 19, 1999; "MERCURY CADMIUM TELLURIDE DEVICES FOR DETECTING AND CONTROLLING OPEN FLAMES" U.S. Ser. No. 08/834,790 filed Apr. 3, 1997; "UNCOOLED MERCURY CADMIUM TELLURIDE INFRARED DEVICES WITH INTEGRAL OPTICAL ELEMENTS" U.S. Pat. No. 5,828,068 issued Oct. 27, 1998; "A METHOD OF FABRICATING A LATERALLY CONTINUOUSLY GRADED HGCDTE LAYER" U.S. Ser. No. 08/831,813 filed Apr. 2, 1997; "INTEGRATED IR DETECTOR SYSTEM" U.S. Ser. No. 08/831,815 filed Apr. 2, 1997; and "NARROW BAND INFRARED FILTER-DETECTORS" U.S. Ser. No. 08/831,814 filed Apr. 2, 1997 (Abandoned).

1. Field of the Invention

This invention generally relates to devices for the detection of open flames to signal hazardous conditions as well as infrared sensing devices for the control of manufacturing processes and, more specifically, to the design, fabrication and application of such devices heretofore operated at cryogenic temperatures.

2. Background of the Invention

When materials burn or explode, emission of light in the visible as well as the invisible infrared (IR) and ultraviolet (UV) wavelengths occur. The chemical composition of the burning flame determines the wavelengths of light emitted. These emissions can be detected by various photosensitive devices for safety, process control or spectroscopic purposes.

Fire detection systems which furnish an electrical output signal in response to a sudden flame or explosion are well known. Such systems are available on the open market, but are high cost items. One of the reasons for this high cost has been the low sensitivity from available detectors as well as the high cost of detector manufacture. The low sensitivity results in low signal to noise ratio of the system which causes a high rate of false alarms. To circumvent the problem of false alarms, the use of individual detectors having different spectral responses has been taught by Kern, et al (see U. S. Patents to Kern et al.: U.S. Pat. No. 4,296,324 entitled "DUAL SPECTRUM INFRARED FIRE SENSOR", issued Oct. 20, 1981; U.S. Pat. No. 4,691,196 entitled "DUAL SPECTRUM FREQUENCY RESPONDING FIRE SENSOR", issued Sep. 1, 1987; U.S. Pat. No. 4,769,775 entitled "MICROPROCESSOR-CONTROLLED FIRE SENSOR", issued Sep. 6, 1988; and U.S. Pat. No. 4,785,292 entitled "DUAL SPECTRUM FREQUENCY RESPONDING FIRE SENSOR", issued Nov. 15, 1988). In addition, intensity comparisons have been made between UV and IR wavelengths to further reduce false alarms. Complex microprocessor logic has been employed to analyze the flicker frequency of the radiation to distinguish a flame from background IR emission.

Axmark, et al (see U. S. Patent to Axmark et al. U.S. Pat. No. 4,370,557 entitled "DUAL DETECTOR FLAME SENSOR" issued Jan. 25, 1983) teaches a system using dual, individual, dissimilar detectors for the control of a multi-burner boiler or industrial furnace installation. The detectors used in Axmark were a silicon (Si) detector responsive to visible light and an IR responsive lead-sulfide (PbS) detector with emphasis on the use of both the direct current (dc) and alternating current (ac) responses of these detectors.

In medical research and chemical analysis, IR spectroscopy is often useful. Instruments to perform this type of analysis typically cost $10,000.00 in 1994 U.S. dollars.

Military applications are another expensive use of IR detection systems. Such systems are generally used for IR imaging similar to radar or for the guidance of heat seeking missiles. Although many different materials are used for these detectors, one of these is mercury-cadmium-telluride, HgCdTe, hereafter referred to as MCT. MCT detectors are cooled well below atmospheric temperatures, typically 77° Kelvin, to accomplish detectivity of targets near atmospheric temperature.

SUMMARY OF THE INVENTION

The present invention applies thin films of MCT (HgCdTe) as IR detectors in an uncooled environment for the detection and control of open flames. This greatly reduces cost over conventional systems due to (1) the elimination of cryogenic cooling equipment, (2) the use of mature semiconductor fabrication technology and (3) the greatly improved signal to noise ratios over other pyrolytic flame detectors. When PbS detectors were applied to commercial flame detectors, they were cited as being 1,000 times more sensitive than pyroelectric detectors. MCT detectors operating at atmospheric temperature are equal to the sensitivity of PbS.

One of the physical attributes that makes MCT so favorable as an IR detector is that a thin film of MCT exhibits a significant change of electrical conductivity when exposed to certain wavelengths of IR radiation. Another important attribute of MCT is that the optical transmission and electrical conductance properties versus IR wavelength may be controlled by the ratio of Hg to Cd in the MCT film. At shorter IR wavelengths than chosen for the fabricated film composition, IR radiation will be greatly attenuated at the same time the electrical conductance will be significantly increased. With little attenuation, the MCT film transmits IR radiation at longer wavelengths than the wavelengths which cause the film conductivity to change. These useful physical attributes are applied to several embodiments of this invention which provide the ability to recognize the chemical compositions of specific gases resulting from combustion.

Many embodiments of this invention use novel processes to achieve the desired IR spectral selectivity by controlling the composition of MCT during film deposition as well as the forming of three dimensional structures through the use of mechanical angle lapping with a diamond point turning (DPT) machine.

A wide choice of fabrication techniques is another advantage claimed for this invention. Embodiments of this invention allow deposition of MCT films the well known semiconductor processes of metal-organo chemical vapor deposition (MOCVD) and molecular beam epitaxial growth (MBE). In addition, MCT films can be deposited by the less familiar method of liquid phase epitaxial growth (LPE)

which was previously described in U.S. Ser. No. 08/834,790 filed Apr. 3, 1997.

Other embodiments of this invention show that a plurality of MCT detectors on the same substrate can be easily realized. These multiple detectors can be configured side-by-side or vertically stacked or both. Since these multiple film detectors can be fabricated in one deposition cycle, this is a particularly cost effective way of realizing detectors having multiple spectrum responses.

Other embodiments of this invention concern the IR transmission and electrical conductance characteristics of MCT which may be used to advantage in novel device structures. In preferred embodiments containing stacked films, CdTe and CdZnTe fill the need for an IR transparent but electrically insulating material.

This is a sensor for, and a method of, determining if a particular type of flame is present using at least two uncooled HgCdTe detector films on a common IR transmissive substrate. Specific examples of type of radiation which can be identified include gasoline flames, natural gas flames, and organic combustion flames (identified, e.g., by comparing the amount of combined carbon dioxide and carbon monoxide to the amount of water vapor). The ratio of carbon dioxide to carbon monoxide can also be determined.

The method can utilize: filtering out radiation of less than a first wavelength to provide a first filtered radiation, and introducing the first filtered radiation into a first HgCdTe detector film and absorbing radiation of less than a second wavelength in the first HgCdTe detector film and sensing an electrical characteristic of the first detector to provide a first signal which is a function of the radiation between the first and the second wavelengths; and then filtering out radiation of less than a third wavelength to provide a second filtered radiation, and introducing the second filtered radiation into a second HgCdTe detector film and absorbing radiation of less than a fourth wavelength in the second HgCdTe detector film and sensing an electrical characteristic of the second detector to provide a second signal which is a function of the radiation between the third and the fourth wavelengths. Determining if a particular type of flame is present can then be done by comparing the first and second signals. The second wavelength and the third wavelength can be the same wavelength.

The sensor can comprise: a first HgCdTe filter on a common IR transmissive substrate, a first uncooled HgCdTe detector film which is on a first CdTe insulator which is on the first filter, and a second uncooled HgCdTe detector film which is on a second CdTe insulator which is either; i) on the first uncooled HgCdTe detector film; or ii) on a second HgCdTe filter which is on the common IR transmissive substrate. Additional HgCdTe detector films may be used on the common substrate, either spaced from, or stacked on, either or both of the first and second detector films. These additional films may be electrically connected to the first and second detector films, or may be sensed to provide additional signals.

Although useful with numerous burning materials, specific embodiments are presented for MCT detectors which may be used to detect the presence of (1) a gasoline fire, (2) a natural gas fire, (3) carbon dioxide ($CO_2$), (4) carbon monoxide (CO), (5) water and (6) mixtures of the latter three. These are used as illustrative generic examples without precluding the detection of other combustive products.

Some of the advantages of the use of uncooled MCT in IR detectors for the novel detection and control of open flames are (1) application tailored spectral responses are easily realized, (2) fabrication costs are economical, (3) lower total systems cost and complexity because of the high IR sensitivity, (4) the compositionally controlled IR transmission of MCT films from opaque to transparent and (5) the compositionally controlled electrical conductance from highly conducting to insulating. From these many desirable characteristics, great utility is realized for the detection of IR emission for fire protection, analysis and manufacturing process control at high sensitivity and economical cost.

BRIEF DESCRIPTION OF THE DRAWINGS

In the drawings, which form an integral part of the specification and are to be read in conjunction therewith, and in which like numerals and symbols are employed to designate similar components in various views unless otherwise indicated:

FIG. 4(($a$)) is a graph showing the IR radiation spectrum of a gasoline fire (prior art.)

FIG. 4(($b$)) is a sketch of a composite detector made from specific film composition of MCT designed to detect a gasoline fire.

FIG. 5(($a$)) is a graph showing the IR radiation spectrum of a natural gas flame from a Bunsen burner (prior art.)

FIG. 5(($b$)) is a sketch of a detector made from specific film compositions of MCT designed to detect a natural gas fire.

FIG. 6(($a$)) is a graph showing the combined IR radiation spectrum of $H_2O$ and $CO_2$ (prior art.)

FIG. 6(($b$)) is a sketch of a detector made from film compositions of MCT designed to detect the combustion gaseous products of any organic fire.

FIG. 7(($a$)) is a graph showing the combined IR radiation spectrum of $CO_2$ and CO (prior art.)

FIG. 7(($b$)) is a sketch of a detector made from film compositions of MCT designed to control an industrial combustion process by detecting the ratio of CO to $CO_2$

DETAILED DESCRIPTION OF PREFERRED EMBODIMENTS

This description of some of the preferred embodiments will be aided by the referral to FIGS. 1–7 and Tables 1–4. In the sketches showing MCT films, the thickness is greatly exaggerated and the scales are neither absolute nor relative.

Figure 1:
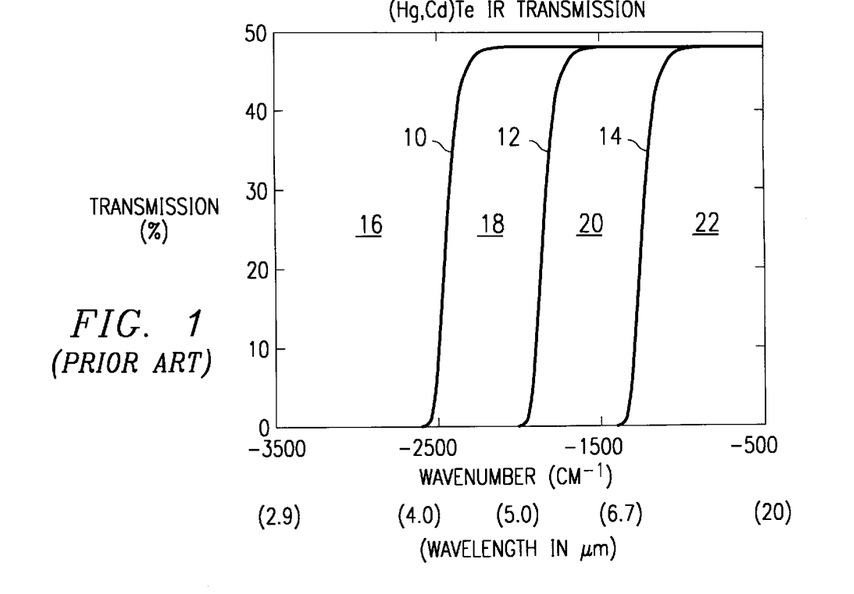
FIG. 1 shows a graph of IR film properties versus MCT film composition (prior art.)

FIG. 1 is a graph of a model of the IR transmission (%) versus wavenumber ($cm^{-1}$) for the MCT film composition $(Hg_{(1-x)}Cd_x)Te$. The IR wavelength in $\mu$m is $-10^4$ divided by the wavenumber. For graph 10, x=0.3. For graph 12, x=0.25. For graph 14, x=0.2. The abscissa of the graph runs from a wavenumber of −3500 (corresponding to a wavelength of 2.9 $\mu$m) to a wavenumber of −500 (corresponding to a wavelength of 20 $\mu$m.) The transmission percentages modeled are illustrative but less than actual because no anti-reflection coatings are assumed. The wavelengths 16 to the left of 10 (4.0 $\mu$m and shorter) are absorbed by MCT film 10 and, if electrodes are attached, an increase in conductance of 10 could be detected when emission in the 16 spectral region illuminates the MCT film. Conversely, wavelengths in regions 18, 20 and 22 which are longer than 4.0 μm would be transmitted through film 10 and no change of conductance in 10 would be seen when illuminated at wavelengths longer than 4.0 μm within spectral regions 18, 20, 22. The novel customization of MCT IR detectors for specific wavelengths makes use of these physical properties.

Figure 2:
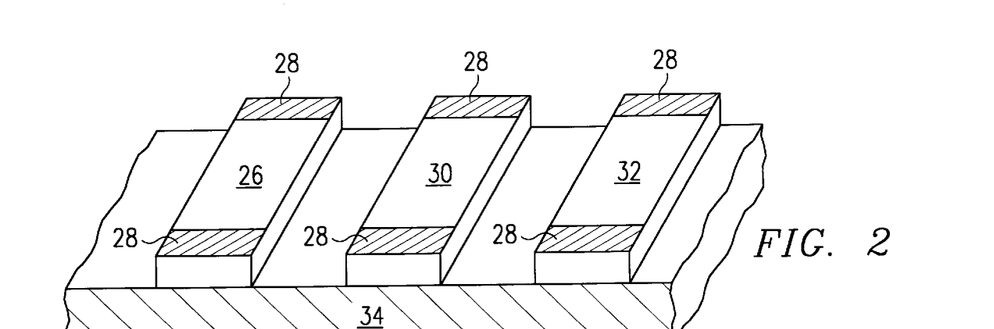
FIG. 2 is a sketch of horizontally positioned multiple MCT detectors which have different IR wavelength sensitivities.

A preferred embodiment sketched in FIG. 2 and described in Table 1 shows a plurality of MCT detectors 26, 30 and 32 on a common substrate 34. Ohmic electrical contacts 28 are made by standard semiconductor processing techniques which are then attached to external sensing circuitry. To show the utility of such an embodiment, for the purpose of example, assume that 26 corresponds to an MCT composition that detects all wavelengths shorter than 20 μm. To improve false alarm rates, detector 26 could be used as a general enabling signal for detectors 30 and 32. Assuming that 30 responds to wavelengths shorter than 4.0 μm and 32 responds to wavelengths shorter than 5.0 μm, we could easily determine if the component flame radiation contains a component between 4.0 and 5.0 μm. The detector configuration can be such to detect radiation on the detector side of the substrate or, with a transparent electrically insulating substrate such as CdTe or cadmium-zinc-telluride (CdZnTe), radiation through the substrate could be detected. External optical filters and lenses can be used between the location to be monitored and the MCT detectors for further enhancement if desired.

TABLE 1

| ID# | Function | Description | Alternates |
|---|---|---|---|
| 26 | Detects IR at wavelengths of 20 μm and below. | $Hg_{0.8}Cd_{0.2}Te$ film | Any wavelength band for compositions of $Hg_{(1-x)}Cd_xTe$ with x from 0.1 to 0.9. |
| 28 | Ohmic contacts | HgTe film | |
| 30 | Detects IR at wavelengths of 4.0 μm and below. | $Hg_{0.7}Cd_{0.3}Te$ film | Any wavelength band for compositions of $Hg_{(1-x)}Cd_xTe$ with x from 0.1 to 0.9. |
| 32 | Detects IR at wavelengths of 5.0 μm and below. | $Hg_{0.75}Cd_{0.25}Te$ film | Any wavelength band for compositions of $Hg_{(1-x)}Cd_xTe$ with x from 0.1 to 0.9. |
| 34 | Substrate for epitaxial film growth, IR transparent or opaque. | CdTe or CdZnTe substrate. | |

Figure 3:
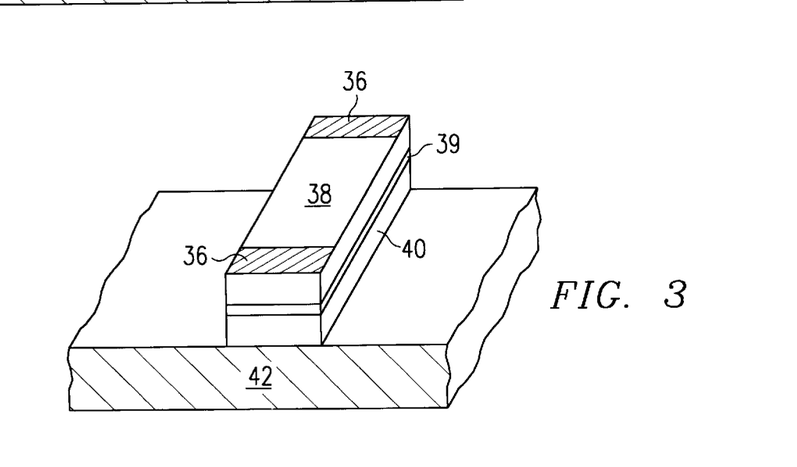
FIG. 3 is a sketch of an MCT detector made from vertically stacked films using both the optical and electrical attributes of MCT to detect specific IR spectra.

A detector assembly composed of vertically stacked MCT detector films is sketched in FIG. 3. For the purpose of illustration, this topology assumes that substrate 42 is transparent to IR. MCT film 40 has no ohmic contacts and is used as an optical filter having an MCT film composition that absorbs wavelengths shorter than, say, 5.0 μm and passes all wavelengths longer than this. Film 39 is CdTe which is IR transmissive but is an electrical insulator. This prevents the changes of conductance of MCT film 40 from affecting the detected conductance of MCT film 38. MCT film 38 has a composition that detects all wavelengths shorter than, say, 6.0 μm. Electrodes 36 coupled to external electronic circuitry will sense an increase in conductivity when radiation between 5.0 and 6.0 μm is passed through the substrate 42. There can be a plurality of such pass-band IR filter detectors on a common substrate, placed either vertically or side-by-side or both, for the detection of specific IR wavelengths, forming a comb filter, either for the purpose of spectroscopic analysis, control or safety alarms. The range of alternate compositions for the MCT films 38 and 40 are shown in Table 1.

Figure 4A:
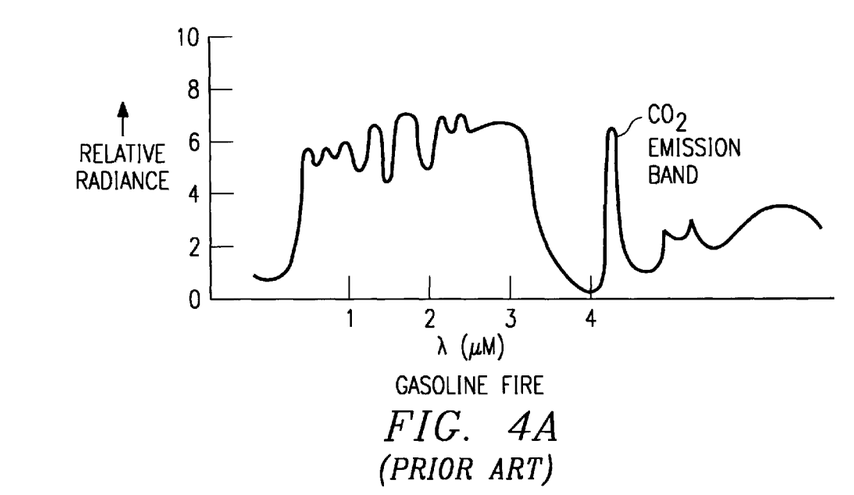
Figure 4B:
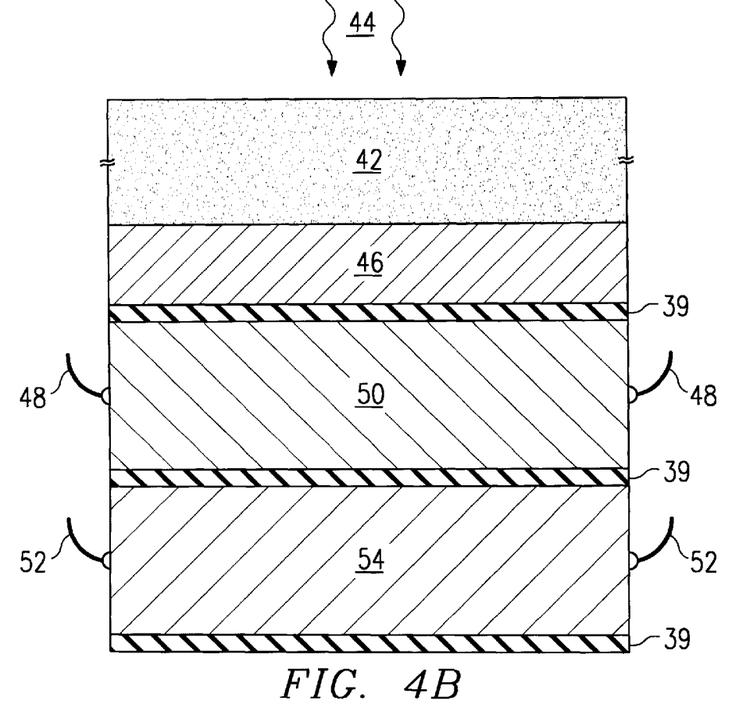

FIG. 4(*a*) shows a graph of the IR radiation spectrum of a gasoline fire in a normal atmosphere. An MCT detector assembly designed for high performance in the detection of gasoline fires is sketched in FIG. 4((*b*)). The materials of composition are shown in Table 2. IR radiation 44 is transmitted through transparent substrate 42 with little attenuation. The x in the MCT composition of $(Hg_{(1-x)}Cd_x)Te$ for the optical filter film 46 is chosen to pass all wavelengths longer than about 1.5 μm and reject shorter wavelengths. The electrically insulating, IR transparent film 39 passes the remaining IR energy without altering the electrical conduction properties of MCI film 50. The MCT composition for detector film 50 is chosen to increase its conductance when exposed to wavelengths lower than about 3.5 μm. Thus the combined response of 42, 46, 39 and 50 are such that an increase of conductivity is observed between the two ohmic contacts 48 attached to 50 when the IR radiation 44 contains spectral components between about 1.5 and about 3.5 μm. From FIG. 4(*a*) it can be seen that this is the broad band of the IR spectrum of a gasoline fire. Film 50 is separated from 54 by another IR transparent, electrically insulating film 39. While 50 responds to IR radiation in the about 1.5 to about 3.5 μm band, it also optically rejects these wavelengths. The MCT composition of MCT detector film 54 is chosen to increase its electrical conductivity when exposed to IR wavelengths lower than 4.5 μm. The resulting response of 42, 46, 50 and 54 is such that an increase of electrical conductivity is observed between electrical contacts 52 when IR radiation 44 contains wavelengths between about 3.5 and about 4.5 μm. As can be seen from FIG. 4(*a*), 3.5 to 4.5 μm encompasses the conspicuous $CO_2$ emission peak. Therefore the detector assembly of FIG. 4(*b*) is uniquely tuned to respond to gasoline fires.

TABLE 2

| ID# | Function | Description | Alternates |
|---|---|---|---|
| 42 | Substrate for epitaxial film growth, IR transparent. | CdZnTe | CdTe |
| 46 | Rejects IR wavelengths below 1.5 μm and passes longer wavelengths. | $Hg_{(1-x)}Cd_xTe$ film with x chosen for a 1.5 μm knee. | |
| 48 | Ohmic contacts to 50. | HgTe | Any metal for ohmic contacts. |
| 50 | Increases electrical conductivity when exposed to IR radiation below 3.5 μm and passes IR radiation at longer wavelengths | $Hg_{(1-x)}Cd_xTe$ film with x chosen for a 3.5 μm knee. | |
| 52 | Ohmic contacts to 54. | HgTe | Any metal for ohmic contacts. |
| 54 | Increases electrical conductivity when exposed to IR radiation below 4.5 μm | $Hg_{(1-x)}Cd_xTe$ film with x chosen for a 4.5 μm knee. | |

Figure 5A:
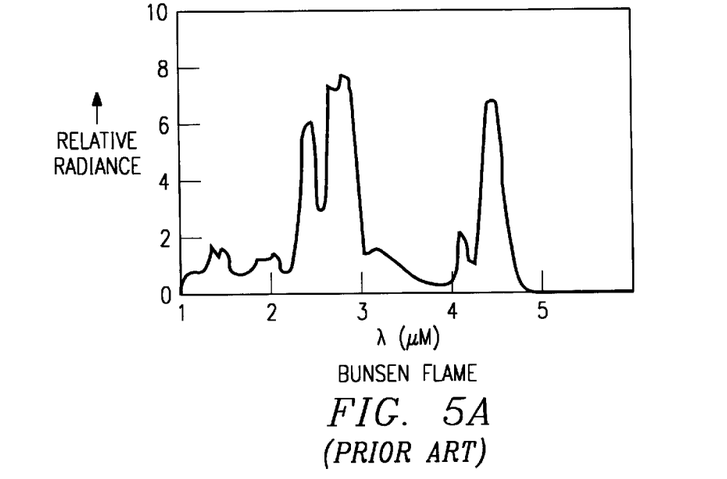
Figure 5B:
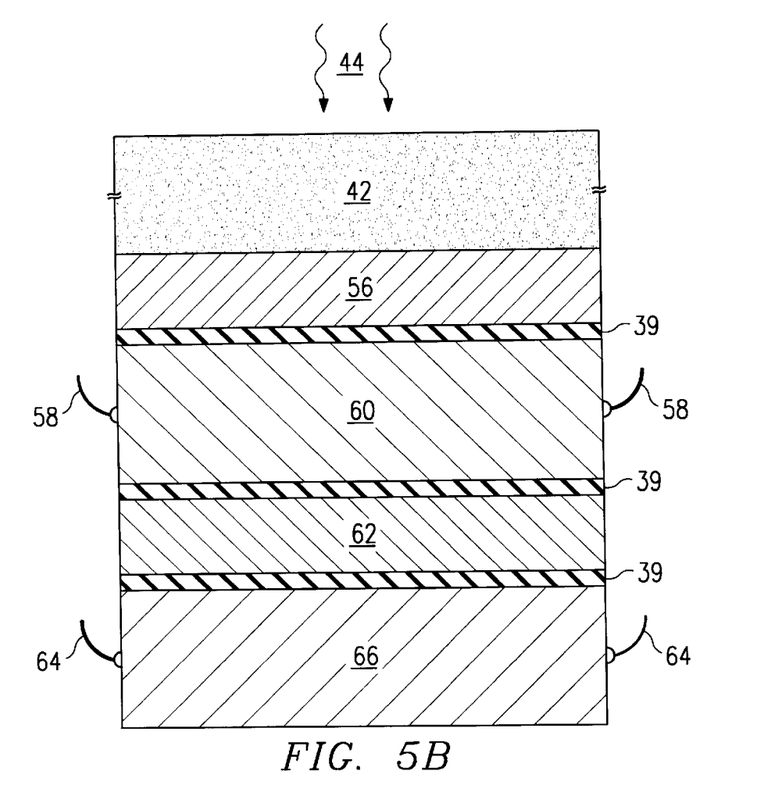

FIG. 5(*a*) shows the IR spectrum from a Bunsen burner flame supplied with natural gas in a normal environmental atmosphere. FIG. 5(*b*) is a sketch of a composite detector made from MCT films (whose compositions are described in Table 3) stacked vertically to detect the combustion of natural gas. The IR radiation 44 from the flame passes through the transparent substrate 42 to an optical filter MCT film 56 whose composition is chosen to reject all wavelengths below about 2.2 μm and pass all longer wavelengths. IR transparent, electrically insulating.

TABLE 3

| ID# | Function | Description | Alternates |
|---|---|---|---|
| 42 | Substrate for epitaxial film growth, IR transparent. | CdZnTe | CdTe |
| 56 | Rejects IR wavelengths below 2.2 $\mu$m and passes longer wavelengths. | $Hg_{(1-x)}Cd_xTe$ film with x chosen for a 2.2 $\mu$m knee. | |
| 58 | Ohmic contacts to 60. | HgTe | Any metal for ohmic contacts. |
| 60 | Increases electrical conductivity when exposed to IR radiation below 3 $\mu$m and passes IR radiation at longer wavelengths | $Hg_{(1-x)}Cd_xTe$ film with x chosen for a 3 $\mu$m knee. | |
| 62 | Rejects IR wavelengths below 4.2 $\mu$m and passes longer wavelengths. | $Hg_{(1-x)}Cd_xTe$ film with x chosen for a 4.2 $\mu$m knee. | |
| 64 | Ohmic contacts to 66. | HgTe | Any metal for ohmic contacts. |
| 66 | Increases electrical conductivity when exposed to IR radiation below 4.8 $\mu$m | $Hg_{(1-x)}Cd_xTe$ film with x chosen for a 4.8 $\mu$m knee. | |

Layer 39 separates film 56 from 60 to preserve the electrical conductivity of MCT detector film 60. The composition of 60 is chosen to increase its electrical conductivity when exposed to IR at any wavelength below about 3 $\mu$m. As a consequence of the physical characteristics of 42, 56 and 60, an increase of electrical conductivity will be seen between electrical contacts 58 when the IR radiation 44 contains spectral components from about 2.2 to about 3 $\mu$m. IR radiation of longer wavelengths than about 3 $\mu$m is passed by the ensemble of 44, 56 and 60. Another electrically insulating, IR transmissive films 39 separate 60 from 62 and 62 from 66 such that changes in electrical conductivity of 62 do not effect the electrical characteristics of either 60 or 62. The IR optical filter MCT film 62 has a composition that rejects all wavelengths lower than about 4.2 $\mu$m and passes all longer wavelengths. The MCT detector film 66 has a composition that increases its conductivity when exposed to IR radiation at wavelengths shorter than about 4.8 $\mu$m. This composite structure results in an increase of electrical conductivity between contacts 64 when IR radiation 44 contains spectral components from about 4.2 to about 4.8 $\mu$m. Thus the composite detector shown in FIG. 5(b) has two spectral response peaks, one at 2.3 to 3 $\mu$m and the other at 4.2 to 4.8 $\mu$m which can be seen from FIG. 5(a) to be dominant in the spectrum of a natural gas flame. Thus the detector described in FIG. 5(b) and Table 3 is uniquely suited to the detection of natural gas combustion.

Figure 6A:
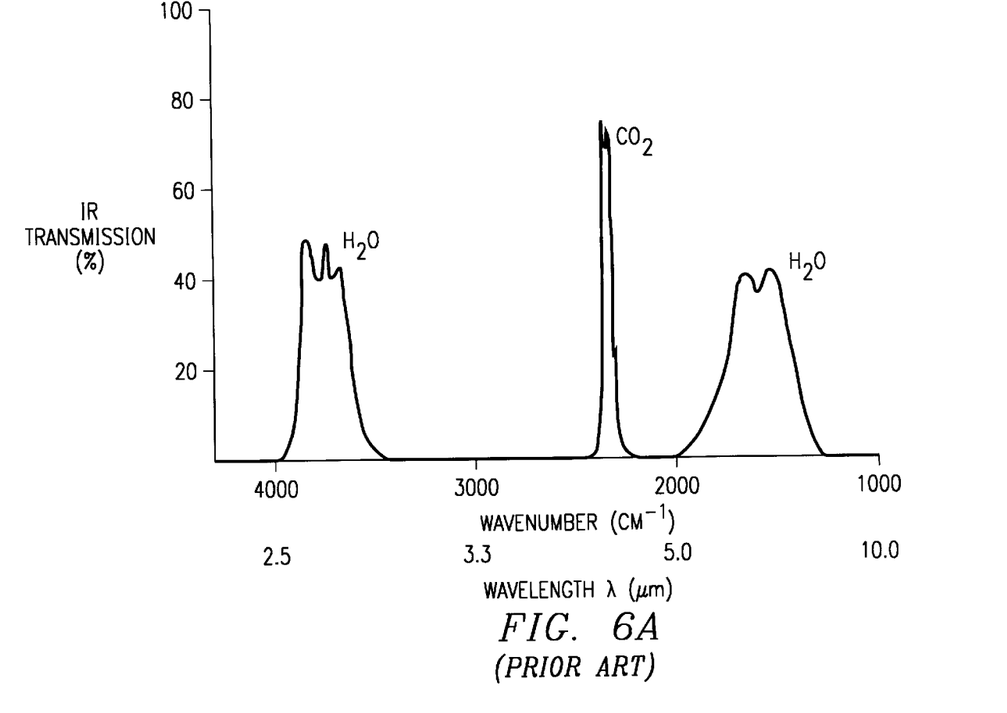
Figure 6B:
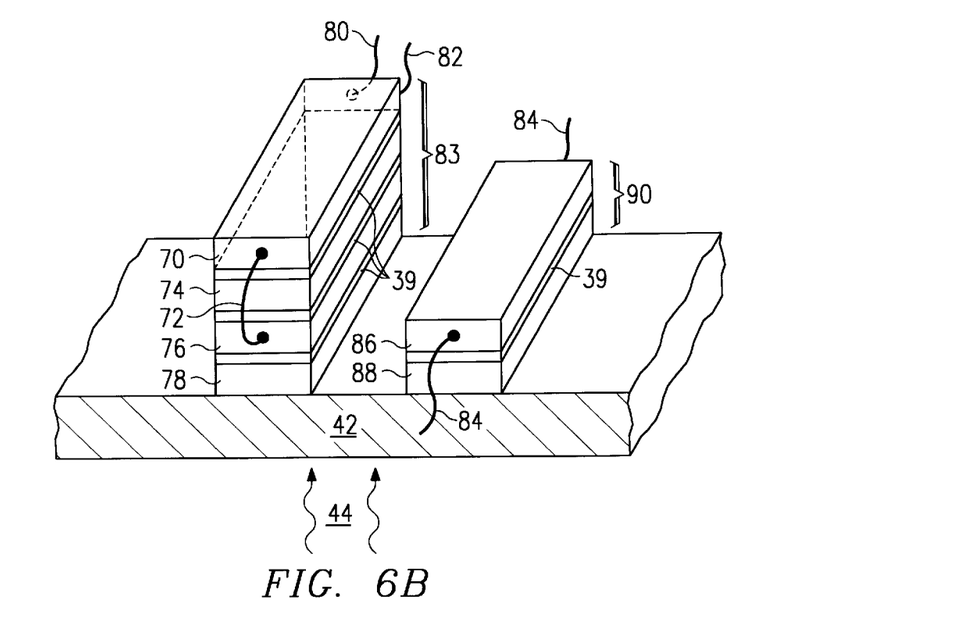

FIG. 6(a) is a graph of the combined IR spectrum of the compounds water and $CO_2$. Since both of these compounds always appear in the combustion of any organic product, a detector which responds independently to $H_2O$ and $CO_2$ should have great utility in the implementation of fire detection, analysis and control. FIG. 6(b) and Table 4 describe an embodiment of such a combustion detector. Because the two IR regions relating to $H_2O$ are relatively broad, a composite MCT film detector 83 of vertically stacked films will be used for the detection of $H_2O$. The spectral peak of $CO_2$ is much sharper so that a separate detector 90 is placed laterally on the same on the same IR transparent substrate 42. The IR radiation 44 passes through substrate 42 encountering MCT filter film 78 whose composition is chosen to pass only IR wavelengths longer than about 2.5 $\mu$m. Electrically insulating, optically transparent films 39 are used in all cases to prevent any cross talk between stacked films. MCT detector film 76 has a composition that increases conductivity when exposed to radiation shorter than about 2.8 $\mu$m and passes all IR wavelengths longer than this. Electrical conductor 72 connects detector film 76 in series with detector film 70. MCT optical filter film 74 has a composition that rejects all wavelengths shorter than about 5.0 $\mu$m which includes the band associated with $CO_2$. MCT detector film 70 has a composition that causes increased electrical conductance when exposed to IR wavelengths shorter than about 8 $\mu$m. This configuration results in IR detector 83 exhibiting an increase in conductance between electrical terminals 80 and 82 when exposed to IR radiation from a fire in which $H_2O$ is a component.

TABLE 4

| ID# | Function | Description | Alternates |
|---|---|---|---|
| 39 | IR transparent, electrically insulating film. | CdZnTe | CdTe |
| 42 | Substrate for epitaxial film growth, IR transparent. | CdZnTe | CdTe |
| 70 | Increases electrical conductivity when exposed to IR radiation at wavelengths below 8.0 $\mu$m. | $Hg_{(1-x)}Cd_xTe$ film with x chosen for a 2.5 $\mu$m knee. | |
| 72 | Ohmic connection to connect detection films 70 and 76 in series. | Any suitable metal | |
| 74 | Rejects IR wavelengths below 5.0 $\mu$m and passes IR at longer wavelengths. | $Hg_{(1-x)}Cd_xTe$ film with x chosen for a 5.0 $\mu$m knee. | |
| 76 | Increases electrical conductivity when exposed to IR radiation at wavelengths below 2.8 $\mu$m and passes longer wavelengths. | $Hg_{(1-x)}Cd_xTe$ film with x chosen for a 2.8 $\mu$m knee. | |
| 78 | Rejects IR wavelengths below 2.5 $\mu$m and passes longer wavelengths. | $Hg_{(1-x)}Cd_xTe$ film with x chosen for a 2.5 $\mu$m knee. | |
| 80, 82 | Ohmic connections to 70 and 76 respectively. | | |
| 84 | Ohmic connections to 86. | Any metal for ohmic contacts. | |
| 88 | Rejects IR wavelengths below 4.2 $\mu$m and passes IR radiation at longer wavelengths | $Hg_{(1-x)}Cd_xTe$ film with x chosen for a 4.2 $\mu$m knee. | | because 70 responds from about 5 to 8 $\mu$m and 76 responds from about 2.5 to 2.8 $\mu$m and 70 and 76 are connected electrically in series by 72.

To avoid spectral attenuation and diffusion of the narrow band of IR radiation associated with $CO_2$, it was deemed good practice to fabricate detector 90 as a separate entity on the same substrate. IR radiation 44 passes through substrate 42 encountering MCT filter film 88 which has a composition to reject all wavelengths below about 4.2 $\mu$m. Electrically insulating, IR transparent film 39 isolates the electrical properties of 88 from 86. MCT detector film 86 has a composition which increases the conductance between terminals 84 when exposed to IR wavelengths shorter than about 4.8 $\mu$m.

This composite $H_2O$ and $CO_2$ low false alarm, flame detector is suited to a wide variety of applications including fire detection in forests, homes, warehouses, factories and so on. The relative intensities of the IR radiation from these two compounds could also be used for industrial control applications.

Figure 7A:
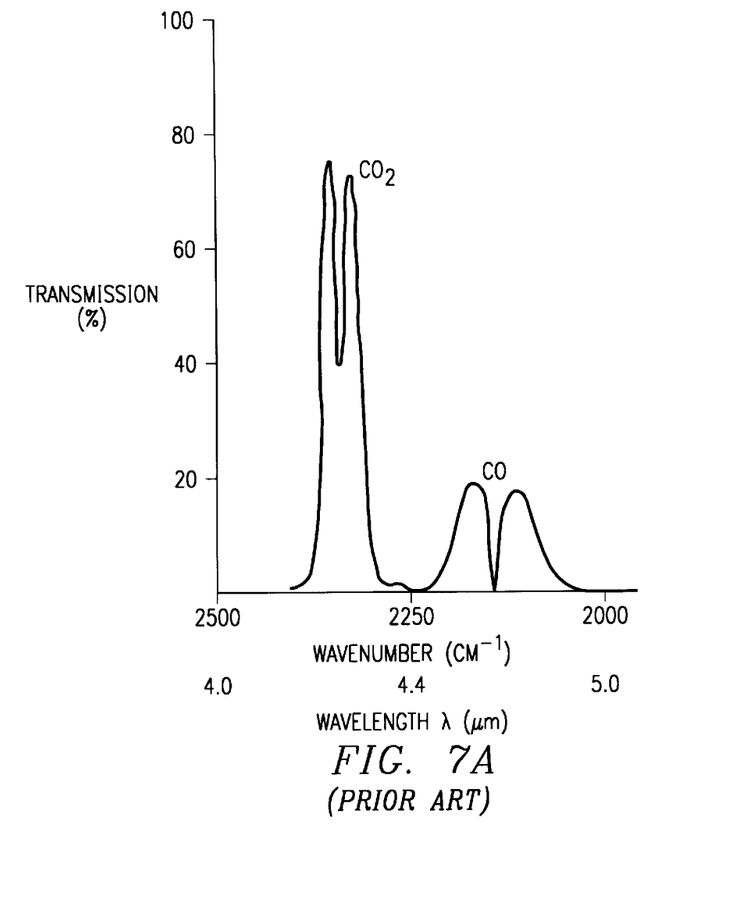
Figure 7B:
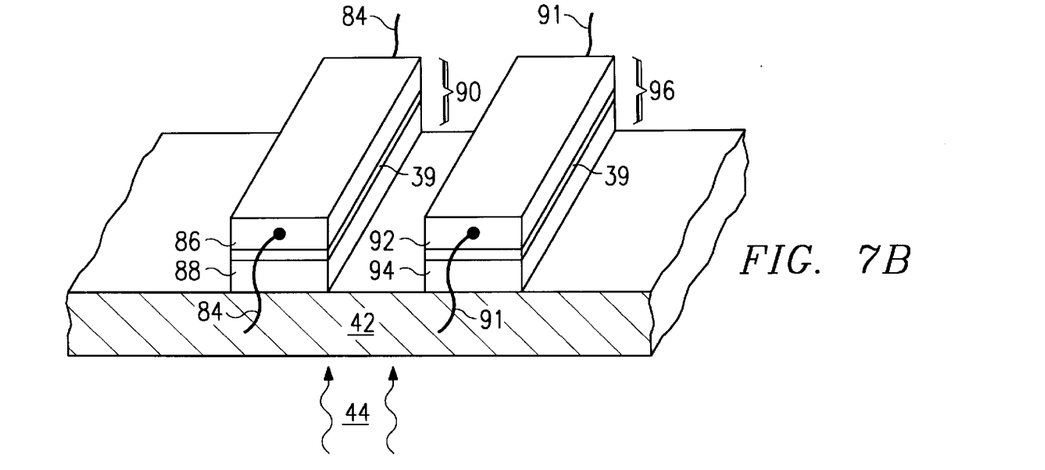

Another embodiment of this invention relates to the ratios of CO to $CO_2$ in air or oxygen fed flames used in industrial manufacturing and in internal combustion engines. Oxygen starved combustion will contain a higher percentage of CO than a properly fed flame. FIG. 7(a) is a graph of the IR spectrums of CO and $CO_2$ combined. FIG. 7((b) is a sketch of a composite detector used to sense both of these combustion products. Since the $CO_2$ detector is identical to the one shown in FIG. 6(b) it will not be further described. The CO detector 96 is of similar structure except for the composition of the MCT films. IR radiation 44 passes through IR transparent substrate 42 and encounters optical filter film 94. The x of the composition of 94, $Hg_{(1-x)}Cd_xTe$, is chosen to reject all IR wavelengths below 4.4 μm and pass all longer wavelengths. IR transparent, electrically insulating CdTe film 39 electrically isolates 92 and 94 without appreciable attenuation of the IR radiation. Detector film 92 has a composition $Hg_{(1-x)}Cd_xTe$ with x chosen to cause an increase the conductance between electrical connections 91 when exposed to IR radiation at wavelengths shorter than about 4.8 μm. Thus IR detector 96 responds to the IR emission wavelengths of CO as a combustion product. Through the use of external electronics and computer components one may use the responses from detectors 90 and 96 to regulate air or oxygen flow in smeltering operations in foundries, etc. as well as to examine exhaust products of internal combustion engines.

While this invention has been described with reference to illustrative embodiments, this description is not intended to be construed in a limiting sense. For illustrative purposes, specifically tuned sensors and geometric arrangements have been chosen for clarity without in any way intending that these examples limit the generic application of MCT IR detectors operated at an uncooled temperature to detect, analyze and control the gaseous products of combustion. The example applications are intended as prototypical and not limited to those included. Many more detectors than two can be placed on the same substrate. An analytic instrument such as an IR spectroscope would contain numerous MCT detectors of variously tuned wavelengths. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of determining if a particular type of flame is present using at least two uncooled HgCdTe detector films on a common IR transmissive substrate, said method comprising:
   a) filtering out radiation of less than a first wavelength to provide a first filtered radiation;
   b) introducing said first filtered radiation into a first HgCdTe detector film and absorbing radiation of less than a second wavelength in said first HgCdTe detector film and sensing an electrical characteristic of said first detector to provide a first signal which is a function of the radiation between said first and said second wavelengths;
   c) filtering out radiation of less than a third wavelength to provide a second filtered radiation;
   d) introducing said second filtered radiation into a second HgCdTe detector film and absorbing radiation of less than a fourth wavelength in said second HgCdTe detector film and sensing an electrical characteristic of said second detector to provide a second signal which is a function of the radiation between said third and said fourth wavelengths; and
   e) comparing said first and second signals.

2. The method of claim 1, wherein said second wavelength and said third wavelength are the same wavelength.

3. The method of claim 2, wherein said first filtering is provided by a first filter HgCdTe which is deposited directly on said common substrate, and a first CdTe insulator is deposited on said first filter and said first HgCdTe detector film is deposited on said first insulator and a second CdTe insulator film is deposited on said first detector film and said second HgCdTe detector film is deposited on said second CdTe insulator film.

4. The method of claim 3, wherein said first HgCdTe detector film provides a first signal which is a function of the radiation between wavelengths of about 1.5 and about 3.5 microns, and said second HgCdTe detector film provides a second signal which is a function of the radiation between wavelengths of about 3.5 and about 4.5 microns, whereby comparison of the first and second signals can provide an indication of a gasoline flame.

5. The method of claim 1, wherein said first HgCdTe detector film provides a first signal which is a function of the radiation between wavelengths of about 1.5 and about 3.5 microns, and said second HgCdTe detector film provides a second signal which is a function of the radiation between wavelengths of about 3.5 and about 4.5 microns, whereby comparison of the first and second signals can provide an indication of a gasoline flame.

6. The method of claim 1, wherein said first filtering is provided by a first HgCdTe filter which is deposited directly on said common substrate, and a first CdTe insulator is deposited on said first filter and said first HgCdTe detector film is deposited on said first insulator and a second HgCdTe filter is deposited directly on said common substrate with said second filter spaced from said first filter and a second CdTe insulator is deposited on said second filter and said second HgCdTe detector film is deposited on said second insulator.

7. The method of claim 6, wherein said first HgCdTe detector film provides a first signal which is a function of the radiation between wavelengths of about 2.2 and about 3.0 microns, and said second HgCdTe detector film provides a second signal which is a function of the radiation between wavelengths of about 4.2 and about 4.8 microns, whereby comparison of the first and second signals can provide an indication of a natural gas flame.

8. The method of claim 6, wherein said first HgCdTe detector film provides a first signal which is a function of the radiation between wavelengths of about 4.2 and about 4.8 microns, and said second HgCdTe detector film provides a second signal which is a function of the radiation between wavelengths of about 4.4 and about 4.8 microns, whereby comparison of the first and second signals can provide an indication of the relative amounts of carbon dioxide and carbon monoxide a flame contains.

9. The method of claim 1, wherein:
   said first filtering is provided by a first HgCdTe filter which is deposited directly on said common substrate, and a first CdTe insulator is deposited on said first filter and said first HgCdTe detector film is deposited on said first insulator and a second CdTe insulator film is deposited on said first detector film and a third HgCdTe detector film is deposited over said second CdTe insulator film and said first detector film and said third detector film are connected in series to produce said first signal; and
   a second HgCdTe filter is deposited directly on said common substrate with said second filter spaced from said first filter and a third CdTe insulator is deposited on said second filter and said second HgCdTe detector film is deposited on said third insulator.

10. The method of claim 9, wherein a third HgCdTe filter is provided directly on said second insulator and a fourth CdTe insulator is provided directly on said third filter, and said third detector is provided directly on said fourth insulator.

11. The method of claim 9, wherein the series combination said first HgCdTe detector film and said third HgCdTe detector film provides a first signal which is a function of the radiation between wavelengths of about 2.5 and about 2.8 microns and the radiation between wavelengths of about 5.0 and about 8.0 microns, and said second HgCdTe detector film provides a second signal which is a function of the radiation between wavelengths of about 4.2 and about 4.8 microns, whereby comparison of the first and second signals can provide an indication of the relative amounts of carbon dioxide and of water vapor a flame contains.

12. A sensor for determining if a particular type of flame is present, said sensor comprising:
   a) a first HgCdTe filter on a common IR transmissive substrate;
   b) a first uncooled HgCdTe detector film which is on a first CdTe insulator which is on said first filter; and
   c) a second uncooled HgCdTe detector film which is on a second CdTe insulator which is on said first uncooled HgCdTe detector film.

13. The sensor of claim 12, wherein:
   said first HgCdTe filter has a composition with a Hg/Cd ratio to absorb radiation of less than about 1.5 microns;
   said first uncooled HgCdTe detector film has a composition with a Hg/Cd ratio to absorb radiation of less than about 3.5 microns; and
   said second uncooled HgCdTe detector film has a composition with a Hg/Cd ratio to absorb radiation of less than about 4.5 microns, whereby the sensor can provide an indication of a gasoline flame.

14. A sensor for determining if a particular type of flame is present using at least three uncooled HgCdTe detector films on a common IR transmissive substrate, said sensor comprising:
   a) a first HgCdTe filter directly on said common substrate;
   b) a first CdTe insulator directly on said first filter;
   c) a first uncooled HgCdTe detector film directly on said first insulator;
   d) a second CdTe insulator film directly on said first detector film;
   e) a second uncooled HgCdTe detector film over said second CdTe insulator film, with said first detector film and said second detector film electrically connected in series;
   f) a second HgCdTe filter directly on said common substrate with said second filter spaced from said first filter;
   g) a third CdTe insulator directly on said second filter; and
   h) a third uncooled HgCdTe detector film directly on said third insulator.

15. The sensor of claim 14, wherein a third HgCdTe filter is provided directly on said second insulator, and a fourth CdTe insulator is provided directly on said third filter, and said second detector is provided directly on said fourth insulator.

16. The sensor of claim 15, wherein:
   said first HgCdTe filter has a composition with a Hg/Cd ratio to absorb radiation of less than about 2.5 microns, and said first uncooled HgCdTe detector film has a composition with a Hg/Cd ratio to absorb radiation of less than about 2.8 microns;
   said third HgCdTe filter has a composition with a Hg/Cd ratio to absorb radiation of less than about 5 microns, and said second uncooled HgCdTe detector film has a composition with a Hg/Cd ratio to absorb radiation of less than about 8 microns; and
   said second HgCdTe filter has a composition with a Hg/Cd ratio to absorb radiation of less than about 4.2 microns, and said third uncooled HgCdTe detector film has a composition with a Hg/Cd ratio to absorb radiation of less than about 4.8 microns, whereby comparison of the first and second signals can provide an indication of the relative amounts of carbon dioxide and of water vapor a flame contains.

17. A sensor for determining if a particular type of flame is present, said sensor comprising:
   a) a first HgCdTe filter on a selected side of a common IR transmissive substrate;
   b) a first uncooled HgCdTe detector film which is on a first CdTe insulator which is on said first filter; and
   c) a second uncooled HgCdTe detector film which is on a second CdTe insulator which is on a second HgCdTe filter which is on said selected side of said common IR transmissive substrate.

18. The sensor of claim 17, wherein said first HgCdTe filter has a composition with a Hg/Cd ratio to absorb radiation of less than about 2.2 microns;
   said first uncooled HgCdTe detector film has a composition with a Hg/Cd ratio to absorb radiation of less than about 3.0 microns;
   said second uncooled HgCdTe detector film has a composition with a Hg/Cd ratio to absorb radiation of less than about 4.8 microns; and
   said second HgCdTe filter has a composition with a Hg/Cd ratio to absorb radiation of less than about 4.2 microns, whereby the sensor can provide an indication of a natural gas flame.

19. The sensor of claim 17, wherein said first HgCdTe filter has a composition with a Hg/Cd ratio to absorb radiation of less than about 4.2 microns;
   said first uncooled HgCdTe detector film has a composition with a Hg/Cd ratio to absorb radiation of less than about 4.8 microns;
   said second uncooled HgCdTe detector film has a composition with a Hg/Cd ratio to absorb radiation of less than about 4.8 microns; and
   said second HgCdTe filter has a composition with a Hg/Cd ratio to absorb radiation of less than about 4.4 microns, whereby the sensor can provide an indication of the relative amounts of carbon dioxide and of carbon monoxide a flame contains.

* * * * *